(12) United States Patent
Bartko et al.

(10) Patent No.: US 10,804,677 B2
(45) Date of Patent: Oct. 13, 2020

(54) STABILIZED DIODE LASER

(71) Applicant: BATTELLE MEMORIAL INSTITUTE, Columbus, OH (US)

(72) Inventors: Andrew P. Bartko, Worthington, OH (US); Ryan W. Daly, Columbus, OH (US); Theodore J. Ronningen, Lewis Center, OH (US); Brad Ross, Westerville, OH (US); Karen Walczak, Hilliard, OH (US)

(73) Assignee: BATTELLE MEMORIAL INSTITUTE, Columbus, OH (US)

( * ) Notice: Subject to any disclaimer, the term of this patent is extended or adjusted under 35 U.S.C. 154(b) by 0 days.

(21) Appl. No.: 16/545,341

(22) Filed: Aug. 20, 2019

(65) Prior Publication Data
US 2020/0067275 A1 Feb. 27, 2020

Related U.S. Application Data

(60) Provisional application No. 62/720,238, filed on Aug. 21, 2018.

(51) Int. Cl.
| | |
|---|---|
| *H01S 5/14* | (2006.01) |
| *H01S 5/024* | (2006.01) |
| *H01S 5/10* | (2006.01) |
| *H01S 5/022* | (2006.01) |
| *H01S 3/08* | (2006.01) |

(52) U.S. Cl.
CPC .......... *H01S 5/141* (2013.01); *H01S 3/08054* (2013.01); *H01S 5/02252* (2013.01); *H01S 5/02264* (2013.01); *H01S 5/02415* (2013.01); *H01S 5/1021* (2013.01)

(58) Field of Classification Search
CPC .. H01S 5/141; H01S 3/08054; H01S 5/02264; H01S 5/02415; H01S 5/02252; H01S 5/1021
See application file for complete search history.

(56) References Cited

U.S. PATENT DOCUMENTS

| | | | |
|---|---|---|---|
| 7,212,553 B2 | 5/2007 | Starodoumov et al. | |
| 8,050,307 B2 * | 11/2011 | Day | B82Y 20/00 372/101 |
| 2002/0031163 A1 | 3/2002 | Tedesco | |
| 2004/0141235 A1 | 7/2004 | Okuta | |

(Continued)

FOREIGN PATENT DOCUMENTS

EP  1726070 B1  7/2018

OTHER PUBLICATIONS

Invitation to Pay Additional Fees for PCT Application No. PCT/US2019/047169; European Patent Office; Rijswijk, Netherlands; dated Jun. 19, 2020.

(Continued)

*Primary Examiner* — Xinning (Tom) Niu
(74) *Attorney, Agent, or Firm* — Thomas E. Lees, LLC

(57) ABSTRACT

A stabilized diode laser device is disclosed, which includes a unibody mounting plate that is mated mechanically to a thermoelectric cooler. The unibody mounting plate comprises chambers in which components, including a laser diode, are aligned and secured. A combination of the secured components within the unibody mounting plate, along with the thermoelectric cooler, provides stabilization of the laser diode.

7 Claims, 11 Drawing Sheets

(56) References Cited

U.S. PATENT DOCUMENTS

| | | |
|---|---|---|
| 2005/0018743 A1 | 1/2005 | Volodin et al. |
| 2005/0207454 A1* | 9/2005 | Starodoumov ......... H01S 5/146 |
| | | 372/4 |
| 2012/0280144 A1* | 11/2012 | Guilfoyle .............. G01J 3/4406 |
| | | 250/458.1 |
| 2014/0072004 A1 | 3/2014 | Connolly et al. |
| 2015/0124848 A1 | 5/2015 | Ovtchinnikov et al. |
| 2015/0184994 A1* | 7/2015 | Flanders ............ G01B 9/02004 |
| | | 356/479 |

OTHER PUBLICATIONS

Andalkar et al.; "Improved external cavity design for cesium D1 (894 nm) diode laser"; Review of Scientific Instruments, AIP, Melville, NY, US; vol. 71, No. 11; Nov. 1, 2000.

Notification of Transmittal with the International Search Report and the Written Opinion of the International Searching Authority for PCT Application No. PCT/US2019/047167; European Patent Office; Rijswijk, Netherlands; dated Aug. 24, 2020.

* cited by examiner

STABILIZED DIODE LASER

CROSS REFERENCE TO RELATED APPLICATIONS

This application claims the benefit of U.S. Provisional Patent Application Ser. No. 62/720,238, filed Aug. 21, 2018, having the title STABILIZED DIODE LASER, the disclosure of which is hereby incorporated by reference.

BACKGROUND

The present disclosure relates generally to lasers and, more particularly, to diode lasers.

Diode lasers have many advantages in field, commercial, and industrial laser applications because of their relatively-low cost, reliability, and well-understood characteristics. Due to these advantages, there are ongoing efforts to improve diode lasers, along with the systems that employ diode lasers.

BRIEF SUMMARY

According to aspects of the present disclosure, a stabilized diode laser device comprises a housing containing a set of components. In a first example, the set of components comprise a laser diode, a collimating lens, and a volume Bragg grating. Under this configuration, the laser diode, collimating lens, and volume Bragg grating are optically aligned such that the collimating lens causes an axis of light emitted by the laser diode to diverge at a controlled angle so that light that reaches the volume Bragg grating is spatially extended to match the laser diode. Also, the volume Bragg grating is positioned to reflect a fraction of the light emitted by the laser diode over a narrow spectral range that interacts with the laser diode and stabilizes a laser diode output to match a reflection spectrum of the volume Bragg grating. Moreover, in operation, the emitted output of the laser diode lases over a rectangular surface. In alternative example configurations, the set of components can further comprise additional optical elements, such as a polarization beam splitting cube, one or more beam expanders, a quarter waveplate, a bandpass filter, combinations thereof, etc., as set out in greater detail herein.

According to further aspects of the present disclosure, a stabilized diode laser device is provided, which comprises a unibody mounting plate that is mated mechanically to a thermoelectric cooler. The unibody mounting plate comprises chambers in which components (e.g., the above-mentioned laser diode, collimating lens, and volume Bragg grating, etc.) are aligned and secured.

According to yet further aspects of the present disclosure, a stabilized diode laser device comprises a unibody mounting plate with chambers. A laser diode is secured in a first one of the chambers, a collimating lens is secured in a second one of the chambers, and a volume Bragg grating is secured in a third one of the chambers. Also, a first optical isolator is secured in a fourth one of the chambers and a first beam expander lens is secured in a fifth one of the chambers. Additionally, a second beam expander lens is secured in a sixth one of the chambers, which is configured to work cooperatively with the first beam expander lens to maintain collimation of propagating light. Similarly, a second optical isolator is secured in a seventh one of the chambers, which is configured to work cooperatively with the first optical isolator to reject undesired polarization of propagating light. Yet further, a bandpass filter is secured in an eighth one of the chambers. The bandpass filter is aligned along a transmission axis with the laser diode, the collimating lens, the volume Bragg grating, the first optical isolator, the first beam expander lens, the second beam expander lens, and the second optical isolator. Also, a thermoelectric cooler is mated mechanically to the unibody mounting plate.

According to still further aspects of the present disclosure, a stabilized diode laser device comprises a unibody mounting plate having an axis, a first chamber located on the axis, a second chamber located on the axis, a third chamber located on the axis, a fourth chamber located on the axis, a fifth chamber located on the axis, a sixth chamber located on the axis, a seventh chamber located on the axis, and an eighth chamber located on the axis.

A first optomechanical holder corresponds to the first chamber, and a laser diode is secured in the first chamber by the first optomechanical holder, where the laser diode is aligned to transmit light along the axis.

A second optomechanical holder corresponds to the second chamber, and a collimating lens is secured in the second chamber by the second optomechanical holder, where the collimating lens is aligned with the laser diode to propagate the light along the axis.

A third optomechanical holder corresponds to the third chamber, and a volume Bragg grating is secured in the third chamber by the third optomechanical holder, where the volume Bragg grating is aligned to further propagate the light along the axis.

A fourth optomechanical holder corresponds to the fourth chamber, and a polarization beam splitter is secured in the fourth chamber by the fourth optomechanical holder, where the polarization beam splitter is aligned to further propagate the light along the axis.

A fifth optomechanical holder corresponds to the fifth chamber. A first beam expander lens is secured in the fifth chamber by the fifth optomechanical holder, where first beam expander lens with the laser diode, the collimating lens, the volume Bragg grating, and the polarization beam splitter to further propagate the light along the axis.

A sixth optomechanical holder corresponds to the sixth chamber. A second beam expander lens is secured in the sixth chamber by the sixth optomechanical holder, where the second beam expander lens is configured to work cooperatively with the first beam expander lens to maintain collimation of the light as the light propagates along the axis. The second beam expander lens is aligned with the laser diode, the collimating lens, the volume Bragg grating, the polarization beam splitter, and the first beam expander lens to further propagate the light along the axis.

A seventh optomechanical holder corresponds to the seventh chamber. A quarter wave plate is secured in the seventh chamber by the seventh optomechanical holder. The quarter wave plate is configured to work cooperatively with the polarization beam splitter to reject undesired polarization of the light as the light propagates along the axis. In this configuration, the quarter wave plate is aligned with the laser diode, the collimating lens, the volume Bragg grating, the polarization beam splitter, the first beam expander lens, and the second beam expander lens to further propagate the light along the axis.

An eighth optomechanical holder corresponds to the eighth chamber. A bandpass filter is secured in the eighth chamber. Here, the bandpass filter is aligned with the laser diode, the collimating lens, the volume Bragg grating, the polarization beam splitter, the first beam expander lens, the second beam expander lens, and the quarter wave plate to further propagate the light along the axis.

A thermoelectric cooler is mated mechanically to the unibody mounting plate to stabilize temperatures at the unibody mounting plate. Under this configuration, the collimating lens, the volume Bragg grating, the polarization beam splitter, the first beam expander, the second beam expander, and the quarter wave plate are aligned axially and rotationally by precision controllers.

According to yet further aspects of the present disclosure, a process comprises providing a unibody mounting plate with chambers aligned along a transmission axis, securing a laser diode in a first chamber of the unibody mounting plate, and activating the laser diode to transmit light along the transmission axis. The process also comprises placing optic components in their respective chambers, monitoring spatial and spectral characteristics of an output from each chamber, and determining whether each optic component is aligned based on the monitored spatial and spectral characteristics of the output from each chamber. The process yet further comprises aligning the optic component in response to determining that the optic component is not aligned, securing each optic component in its respective chamber in response to determining that the optic component is aligned, and deactivating the laser diode upon securing each optic component in its respective chamber.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

As used herein, a "laser diode" is a semiconductor-based laser that utilizes an electrical current to emit light. Comparatively, a "diode laser device" is a laser device, which comprises one or more laser diodes, and can optionally include additional components, such as optics.

Diode laser devices have many advantages for field, commercial, and industrial laser applications. For instance, laser diodes that are utilized by corresponding diode laser devices, are typically relatively inexpensive. Also, the reliability of conventional laser diodes is well understood and characterized. Moreover, laser diodes only require electrical power as a consumable, thus no gas or liquid additive is required to cause the laser diode to emit light. Yet further, laser diodes can be designed to cover a broad spectral range, and can further produce a broad range of optical power output, e.g., up to tens of watts of continuous wave (CW) optical power.

However, for many applications, such as spectroscopic, sensing, and communication applications, it is desirable to stabilize the inherent spectral output of the diode laser device. It can also be desirable to narrow the spectrum of the diode laser device. A conventional diode laser device typically has a spectral width on the order of several nanometers. However, stabilization of the laser diode as described herein can reduce the spectral width by two to three orders of magnitude. Moreover, conventional approaches to stabilize a laser diode result in a reduction of optical power output and present risks of reducing the life of the laser diode. The reduced life results for instance, from retroreflected light that hits the laser diode, thereby damaging the laser diode's crystal structure. As such, conventional diode laser devices maintain the operational power of the corresponding laser diode(s) well below their maximum output power to reduce the risk of damage to their crystal structure. However, aspects herein eliminate or reduce risk of reduced life from retroreflected light of the laser diode. To address such problems, the present disclosure provides embodiments that describe a stabilized diode laser device as set out in greater detail herein with regard to the FIGURES.

Figure 1:
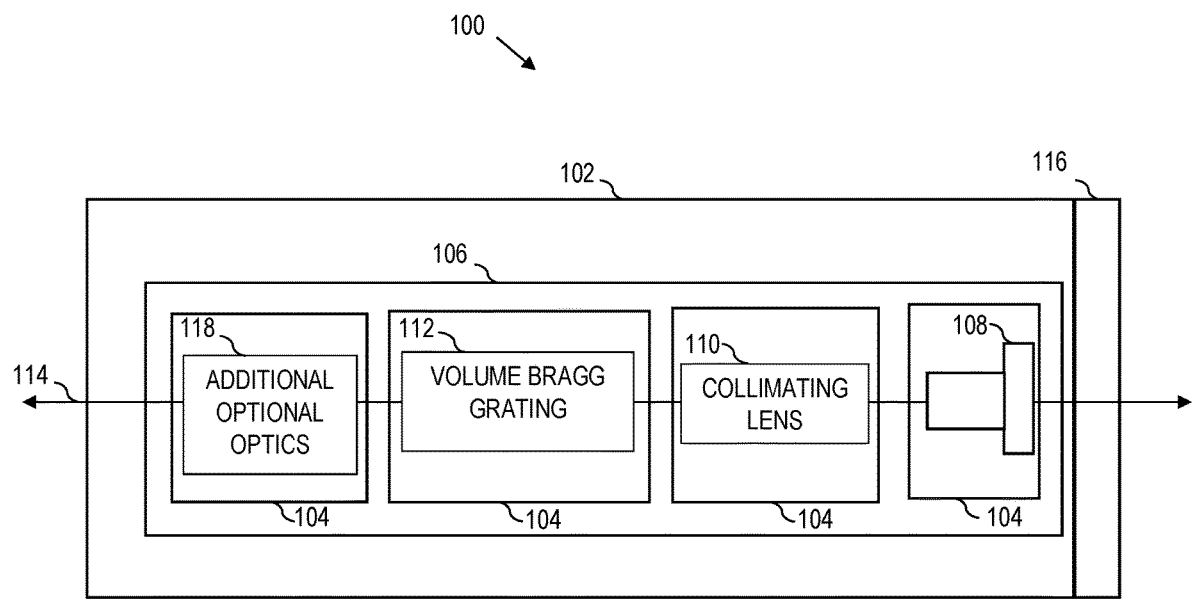
FIG. 1 is a block diagram showing an embodiment of a stabilized laser according to aspects of the present disclosure.

Referring now to the drawings, and in particular to FIG. 1, a stabilized diode laser device 100 is illustrated in block diagram form according to aspects of the present disclosure. The stabilized diode laser device 100 comprises a housing 102 (e.g., comprising a mounting plate, unibody mounting plate, etc.) that comprises a stack up of single-axis translation and rotation stages 104, where each translation and rotation stage 104 holds a corresponding optical component of the stabilized diode laser device 100. The translation and rotation stages 104 may include an optomechanical holder, a clamp that holds each component in position, etc., examples of which are described more fully herein. In this regard, each translation and rotation stage 104 may be uniquely sized, configured, and positioned based upon the associated optic component held thereby. For instance, in an example configuration, the housing 102 can comprise a unibody mounting plate with multiple channels (or cavities) aligned along a transmission axis (or transmission pathway), where each channel defines a corresponding one of the translation and rotation stages 104. Optic components are secured in each of the channels, e.g., using a suitable optomechanical holder and corresponding clamp.

In the illustrated embodiment, the housing 102 contains a set of components 106, each component in a corresponding translation and rotation stage 104. In an example embodiment, the set of components 106 includes a laser diode 108 that is controlled to emit an output comprising light, as will be described in greater detail herein. The set of components 106 also comprises a collimating lens 110 (e.g., a spherical lens) and a volume Bragg grating 112. The laser diode 108, collimating lens 110, and volume Bragg grating 112 are each held by a corresponding instance of the translation and rotation stage 104, and are optically and rotationally aligned 114 such that the collimating lens 110 causes an axis of light emitted by the laser diode 108 to diverge at a controlled angle so that light that reaches the volume Bragg grating 112 is spatially extended to match the laser diode 108. For instance, in an example embodiment, the laser diode 108, collimating lens 110, and volume Bragg grating 112 are optically and rotationally aligned 114 such that the collimating lens 110 causes one axis of light emitted by the laser diode 108 to diverge at a controlled angle so that light that reaches the volume Bragg grating 112 is spatially extended to match the laser diode 108.

Moreover, the volume Bragg grating 112 is positioned to reflect a fraction of the light emitted by the laser diode 108 over a narrow spectral range that interacts with the laser diode 108 and stabilizes a laser diode output, e.g., to match a reflection spectrum of the volume Bragg grating 112. Under this configuration, the emitted output of the laser diode 108 lases over a rectangular surface (compared to a typical smaller, square surface). In an illustrative implementation, the volume Bragg grating 112 is optically aligned with the laser diode 108 to reduce the laser diode spectral width by an order of magnitude of at least two.

In an example implementation, the laser diode 108 is stabilized (e.g., exhibits a narrow spectral width), enabling the diode laser device 100 to support spectroscopic applications. In this regard, the diode laser device 100 is a high power device (e.g., a power output up to 800 mW), and is stable over a broad environmental temperature range (e.g., −10 to 50 C). Moreover, in some embodiments, the diode laser device 100 is spatially extended (e.g., rectangular surface) instead of a point source. The combination of these characteristics provides a stabilized diode laser device 100 that is well suited to Raman spectroscopy, fluorescence spectroscopy and other laser sensing applications in both laboratory and fielded systems.

In the example illustrated embodiment, the volume Bragg grating 112 stabilizes the spatially extended laser diode 108. Desired environmental stability is provided, for instance, by incorporating a unibody mounting plate that cooperates with a thermoelectric cooler 116 to extend thermal changes equally across one or more of the components in the set of components 106, e.g., the volume Bragg grating 112, and optionally, any additional beam shaping optics in the set of components set of components 106.

In a further example embodiment, the set of components 106 can include one or more other optical components 118. For instance, the stack up of single-axis translation and rotation stages 104 can comprise additional stages, which can include a polarization rotation wave plate, one or more compensating lens(es), a beam splitter, an optical filter that rejects light outside of a wavelength range of interest, etc. By way of example, in an example embodiment, the set of components 106 includes a polarization rotation wave plate seated in a first one of the additional stages, a first compensating lens seated in a second one of the additional stages, a second compensating lens seated in a third one of the additional stages, a beam splitter in a fourth one of the additional stages, an optical filter that rejects light outside of a wavelength range of interest in a fifth one of the additional stages, combinations thereof, etc.

Because of the sensitivity to position and angle, thermal expansion and contraction may negatively impact the performance of the laser diode 108. However, according to aspects of the present disclosure, the housing 102 comprises a single mounting plate (also referred to herein as a unibody mounting plate) that secures each component of the set of components 106 to the housing 102. The unibody mounting plate is mated mechanically to a thermoelectric cooler 116 to thermally stabilize the mounting plate. This thermal stabilization prevents the components from shifting relative to one another. This thermal stabilization also prevents expansion or contraction of the volume Bragg grating 112 that would alter its spectral characteristics. Such a stabilization approach is effective, e.g., over an environmental temperature range of −10 to 50 C.

In a particular implementation, the housing 102 (e.g., a unibody mounting plate) comprises a stack up of single-axis translation and rotation stages 104 associated with the set of components 106. The translation and rotation stages 104 may also include a clamp that holds each component of the set of components 106 in its desired position. For instance, in an example implementation, the unibody mounting plate comprises chambers in which components (e.g., laser diode 108, collimating lens 110, volume Bragg grating 112, etc.) are aligned and secured. A combination of the secured components within the unibody mounting plate of the housing 102, along with the thermoelectric cooler 116, provides relatively better stabilization compared to conventional diode lasers. The stabilization is highly sensitive to the angles and positions of the optics. However, according to aspects of the present disclosure herein, an assembly station centers around a stack up of single-axis translation and rotation stages, where one or more station(s) can include an optomechanical holder and clamp (e.g., a pneumatic clamp) to hold each optic in position. Using precision position controllers, these stages provide positioning accuracy, e.g., below one micron.

In example implementations, the laser output is monitored during the assembly process. As each optic is put into place, the desired spectral and spatial characteristics of the laser beam are specified, and the optic's position and angle are adjusted until the specified performance is achieved. The optic and holder are then secured, and the assembly moves on to the installation of the next optic in the same manner. By way of example, the spatial and spectral characteristics of each component can be tuned to meet predetermined alignment criterion, which can account for shifts and other characteristics of the build process such that upon completion, the optics have finally shifted into optimal optical alignment (both spatial and spectral).

In example embodiments, the stabilized laser light is further controlled by the addition of a polarization rotation wave plate, a beam splitter to reject the undesired polarization, and a pair of compensating lenses that collimate the light so that the output beam of the diode laser device 100 is collimated, as described more fully herein. An optical filter can optionally be utilized to further improve the rejection of light outside of the wavelength range of interest.

Figure 2:
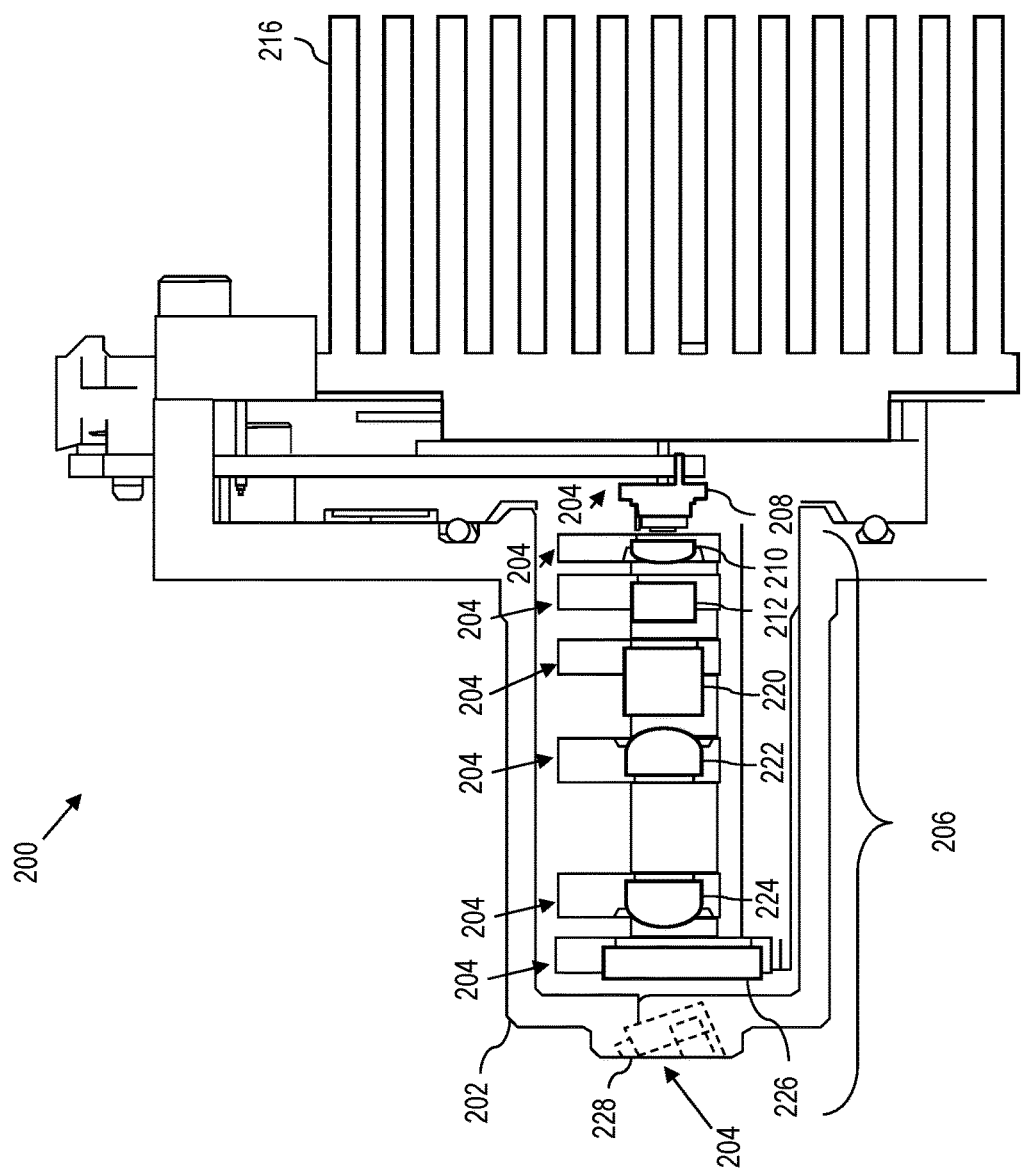
FIG. 2 is a diagram showing one embodiment of a stabilized laser.

Referring to FIG. 2, a diagram shows an embodiment of a stabilized diode laser device 200 according to aspects of the present disclosure herein. The stabilized diode laser device 200 comprises components analogous to those set out with reference to the stabilized diode laser device 100 of FIG. 1. As such, the discussion of FIG. 1 is incorporated into FIG. 2. Moreover, like components between FIG. 1 and FIG. 2 are referenced with like reference numerals that are 100 higher in FIG. 2. Where analogous components are utilized, a detailed description may be omitted, whereupon reference is made to the counterpart description of FIG. 1.

The stabilized diode laser device 200 has a housing 202 comprising a unibody mounting plate. The unibody mounting plate of the housing 202 comprises a plurality of translation and rotation stages 204, implemented as multiple chambers, e.g., channels (or cavities) aligned along a transmission axis (or transmission pathway). As such, in this embodiment, a translation and rotation stage may also be referred to herein as a chamber 204. Thus, a component is secured in each of the illustrated chambers 204, making up a set of components 206.

In the embodiment of FIG. 2, a laser diode 208 is secured in a first chamber 204 so as to transmit light along the transmission axis when the laser diode 208 is activated. In an example implementation, the laser diode 208 is an extended diode, which can have a rated power output, for instance, of approximately 800 milliwatts (mW).

The stabilized diode laser device 200 stabilizes the laser diode 208 using a combination of a collimating lens and a volume Bragg grating. Continuing along the transmission axis, a collimating lens 210 is secured in a second chamber 204, and a volume Bragg grating 212 is secured in a third chamber 204, such that the volume Bragg grating 212, the collimating lens 210, and the laser diode 208 are aligned along the transmission axis. In an example implementation, the collimating lens 210 comprises a spherical lens that is designed and is positioned so that one axis of the light is diverging at a controlled angle as the diverging light reaches the volume Bragg grating 212. In this illustrative example implementation, the volume Bragg grating 212 is spatially extended to match the laser diode 208.

In an example embodiment, the volume Bragg grating 212, the collimating lens 210, and the laser diode 208 are aligned both axially and rotationally. The combination of the collimating lens 210 and the volume Bragg grating 212 permit stabilization of the stabilized diode laser device 200 by controlling the angle of light using the collimating lens 210 and, thereafter, spatially matching the volume Bragg grating 212 with the laser diode 208. Here, the volume Bragg grating 212 is designed and positioned so that the volume Bragg grating 212 reflects a fraction of the light over a narrow spectral range. The reflected light interacts with the laser diode 208, which stabilizes the output of the laser diode 208 to match the reflection spectrum of the volume Bragg grating 212.

Stabilization is highly sensitive to angles (rotational alignment) and translational positions (axial alignment) of the optic components. As such, high precision positioners are used to align the optic components (e.g., using a combination of optomechanical holders and assembly jigs). Once aligned, optomechanical holders (such as pneumatic clamps) are used to secure the aligned optic components in their respective channels. Furthermore, using a single unibody mounting plate to secure the components, including the laser diode 208, the collimating lens 210, and the volume Bragg grating 212 results in improved stabilization relative to conventional diode lasers.

Continuing along the transmission axis of FIG. 2, a first optical isolator 220 (shown in FIG. 2 as a polarization beam splitter 220) is secured in a fourth chamber 204. Next, a first beam expander lens 222 and a second beam expander lens 224 (collectively designated as beam expander lenses) are secured in a fifth chamber 204 and a sixth chamber 204, respectively. The first beam expander lens 222 works cooperatively with the second beam expander lens 224 to maintain collimation of propagating light.

Next, a second optical isolator 226 (shown in FIG. 2 as a quarter wave plate 226) is secured to a seventh chamber 204. The second optical isolator 226 works cooperatively with the first optical isolator 220 to reject undesired polarization of propagating light.

The first optical isolator 220, the beam expander lenses 224, 226, and the second optical isolator 226 are aligned axially and rotationally along the transmission axis using high precision positioners. Once aligned, these optic components 220, 222, 224, 226 are secured to their respective channels by pneumatic clamps, optomechanical holders, other holding devices, combinations thereof, etc. Also, on the transmission axis of FIG. 2, a bandpass filter 228 is secured to the diode laser device 200 to further reject any light that is outside of the relevant wavelength range.

The entire unibody mounting plate of the housing 202 is mated mechanically to a thermoelectric cooler 216, which comprises a heat sink and a fan that is operatively coupled to the heat sink of the thermoelectric cooler 216. The thermoelectric cooler 216 dissipates heat from the unibody mounting plate, thereby stabilizing temperatures at the unibody mounting plate. The thermal stabilization prevents the components (e.g., laser diode 208, collimating lens 210, volume Bragg grating 212, first optical isolator 220, first beam expander lens 222, second beam expander lens 224, second optical isolator 226, and bandpass filter 228) from shifting relative to one another. Furthermore, thermal stabilization reduces expansion or contraction of the volume Bragg grating 212. Because thermal expansion or contraction alters the spectral characteristics of the volume Bragg grating 212, the reduction of thermal expansion or contraction results in a corresponding stability to the spectral characteristics of the volume Bragg grating 212.

By axially and rotationally aligning specific optic components (collimating lens 210, volume Bragg grating 212, first optical isolator 220, first beam expander lens 222, second beam expander lens 224, second optical isolator 226, and bandpass filter 228) on a unibody mounting plate using precision positioners, securing those aligned components (collimating lens 210, volume Bragg grating 212, first optical isolator 220, first beam expander lens 222, second beam expander lens 224, second optical isolator 226, and bandpass filter 228) such as with optomechanical holders (e.g., pneumatic clamps), and dissipating heat using the thermoelectric cooler 216, the system of FIG. 2 provides stabilization for a stabilized diode laser device 200, thereby increasing its operational life relative to conventional diode lasers.

According to aspects of the present disclosure, a stack up of single-axis translation and rotation stages 204 utilize a corresponding set of pneumatic clamps, each pneumatic clamp holding a corresponding component in the set of components 206 in a fixed position. Using precision position controllers, these stages can provide positioning accuracy e.g., below one micron.

In an example implementation, a diode laser device 200 is effective over environmental temperatures that range from negative ten degrees Celsius (−10° C.) to plus fifty degrees Celsius (+50° C.), maintaining the performance of optic components and the system within acceptable tolerances. Moreover, the diode laser device 200 can be stabilized (narrow spectral width) to support spectroscopic applications, and can have a power output, e.g., up to and optionally exceeding 800 milliwatts. (mW). Moreover, in example implementations, the diode laser device 200 is spatially extended instead of a point source. The combination of these characteristics provides a laser that is well suited to Raman spectroscopy, fluorescence spectroscopy and other laser sensing applications in both laboratory and field systems. Moreover, the diode laser device 200 only requires electrical power as a consumable and not any gas or liquid additive.

For many spectroscopic, sensing and communication applications, it is desirable to stabilize a laser diode's inherent spectral output and narrow its spectrum. A typical spectral width of a laser diode is on the order of several nanometers, but stabilization techniques can reduce this by two to three orders of magnitude. Stabilizing a laser diode typically reduces the optical power output and risks reducing the lifetime of the laser diode. The lifetime risk comes from retroreflected light hitting the laser diode and damaging its crystal structure. Therefore, the operational power is typically kept well below the maximum output power to reduce this risk. However, aspects of the present disclosure eliminate the above problems by stabilizing a laser diode in such a way that high output power is achievable without reducing the lifetime of the laser diode, using the structures described more fully herein.

More particularly, aspects of the present disclosure address these problems by stabilizing an extended diode that has a rated power output, e.g., of up to 800 mW or greater. As noted more fully herein, an "extended diode" lases over a rectangular surface instead of a smaller, typically square surface, thereby increasing both the power output and the spatial extent of the generated light. By extending the diode in one dimension, the power output increases as well as the spatial extent of the generated laser light. By stabilizing this extended diode, the diode laser device 100, 200 can achieve an optical power of several hundred mW (e.g., 800 mW) while still reducing the risk of early failure.

Figure 3:
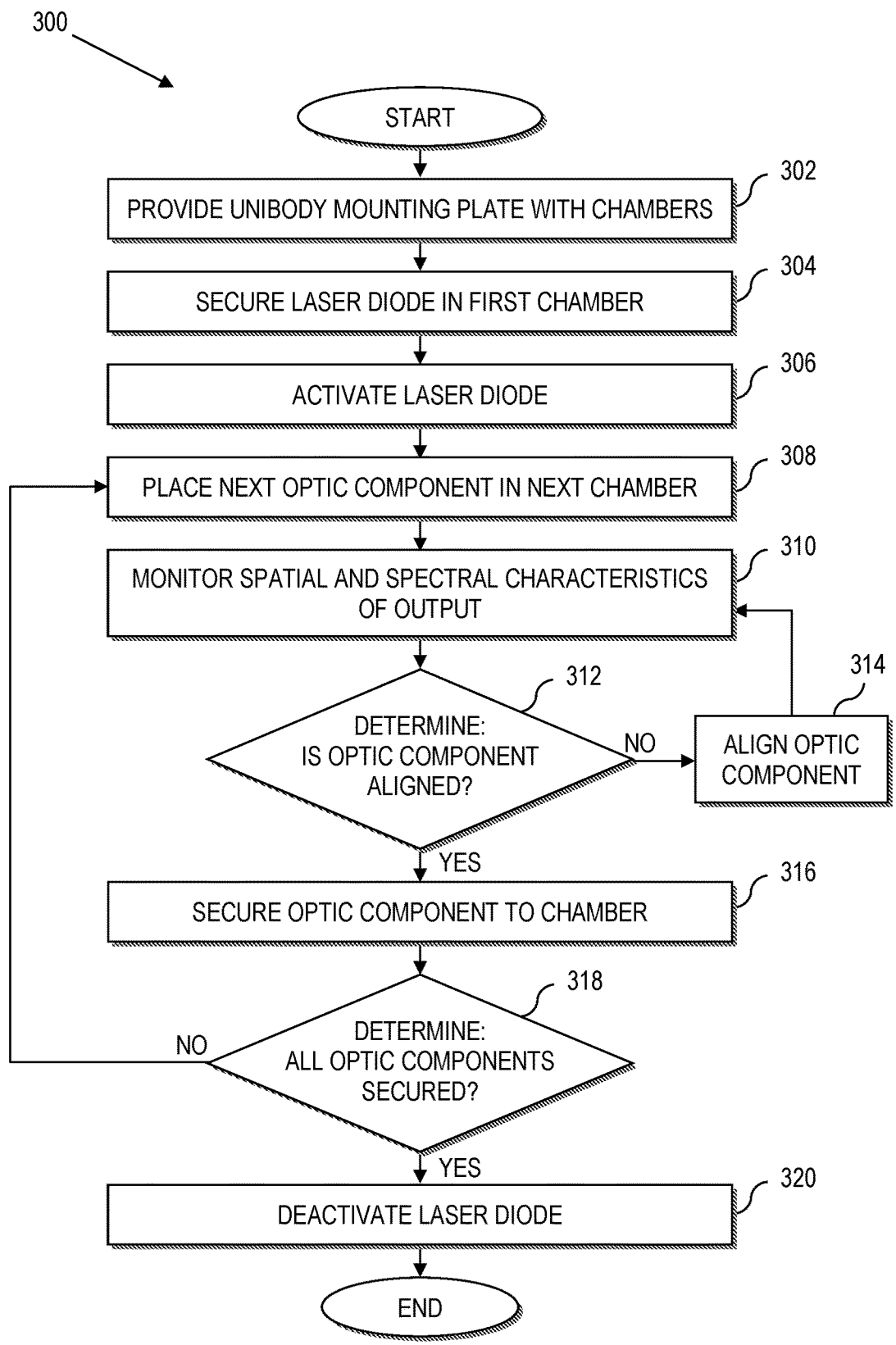
FIG. 3 is a flowchart showing one embodiment of a process for manufacturing stabilized lasers.

Referring now to FIG. 3, a process 300 illustrates an example, embodiment of processes relating to the stabilized diode laser 100 of FIG. 1 and/or stabilized diode laser 200 of FIG. 2. Likewise, FIG. 4A-FIG. 4H collectively illustrate an example process 400 relating to the stabilized diode laser 100 of FIG. 1 and/or stabilized diode laser 200 of FIG. 2.

In general, laser output is monitored during the assembly process. As each optic component is put into place (e.g., positioned in a corresponding rotation and translation stage 104, 204, etc.), the desired spectral and spatial characteristics of the laser beam are specified, and the optic's position and angle are adjusted until this is achieved. For instance, the laser beam spatial mode output can be adjusted to achieve a predefined beam shape and beam divergence that is necessary to satisfy the optical prescription of the next downstream optic. Metrics, such as beam length and height can be adjusted to be within a clear aperture of the next downstream optic. Also, the beam divergence (in both dimensions) can be adjusted to be within a previously defined acceptance angle for the next optic to alter the divergence in an optimal manner. The optic and holder are then secured, and the assembly moves on to the installation of the next optic in the same manner.

The stabilized laser light can be further controlled by the addition of a polarization rotation wave plate and a beam splitter to reject the undesired polarization. A pair of compensating lenses collimate the light so that the diode laser output beam is collimated. An optical filter further improves the rejection of light outside of the wavelength range of interest.

As noted more fully herein, because of the sensitivity to position and angle, thermal expansion and contraction would negatively impact the diode laser device. Therefore, the diode laser device 100, 200 herein, uses a single mounting plate to secure all of the optical components (including the diode) in place, and this mounting plate is thermally stabilized using a thermoelectric cooler. This thermal stabilization prevents the optical components from shifting relative to one another, and it prevents expansion or contraction of the volume Bragg grating that would alter its spectral characteristics.

As shown in FIG. 3, and embodiment of the process 300 begins by providing 302 a unibody mounting plate with chambers aligned along a transmission axis (or transmission pathway). A laser diode is secured 304 in a first chamber and, thereafter, the laser diode is activated 306. The activation 306 of the laser diode results in output of light from the laser diode, thereby allowing the monitoring of spatial and spectral characteristics of the light at various output stages.

Continuing with FIG. 3, an optic component is placed 308 in the next chamber along the transmission axis and the spatial and spectral characteristics of the output are monitored 310. Based on the monitored 310 spatial and spectral characteristics, the process determines 312 whether or not the optic component is properly aligned. If the process determines 312 that the optic component is not properly aligned, then the optic component is aligned 314, preferably using high precision positioners. Thereafter, the spatial and spectral characteristics of the output are again monitored 310.

If the process determines 312 that the optic component is properly aligned, then the aligned optic component is secured 316 to the chamber using one or more optomechanical holders, such as, for example, pneumatic clamps.

Next, the process determines 318 whether or not all of the optic components have been secured in their respective channels. If all of the optic components have not been secured, then the next optic component is placed 308 in the next chamber, and the process repeats itself until all optic components have been secured in their respective chambers. When the process determines 318 that all optic components have been secured in their respective chambers, the laser diode is deactivated 320, and the process of FIG. 3 ends.

As shown in the embodiment of FIG. 3, by sequentially placing, aligning, and securing optic components one-by-one (e.g., in a step-wise manner) in their respective chambers and monitoring the spatial and spectral characteristics of the output after placing and aligning each optic component, the process 300 of FIG. 3 results in precision manufacture of stabilized diode lasers.

FIGS. 4A, 4B, 4C, 4D, 4E, 4F, 4G, and 4H (collectively designated as FIG. 4) are flowcharts showing another embodiment of a process 400 for manufacturing a stabilized diode laser 100 of FIG. 1 and/or stabilized laser diode 200 of FIG. 2. Specifically, FIG. 4 provides greater detail on the manufacture of the stabilized diode laser 100 of FIG. 1 and/or the stabilized diode laser 200 of FIG. 2.

Figure 4A:
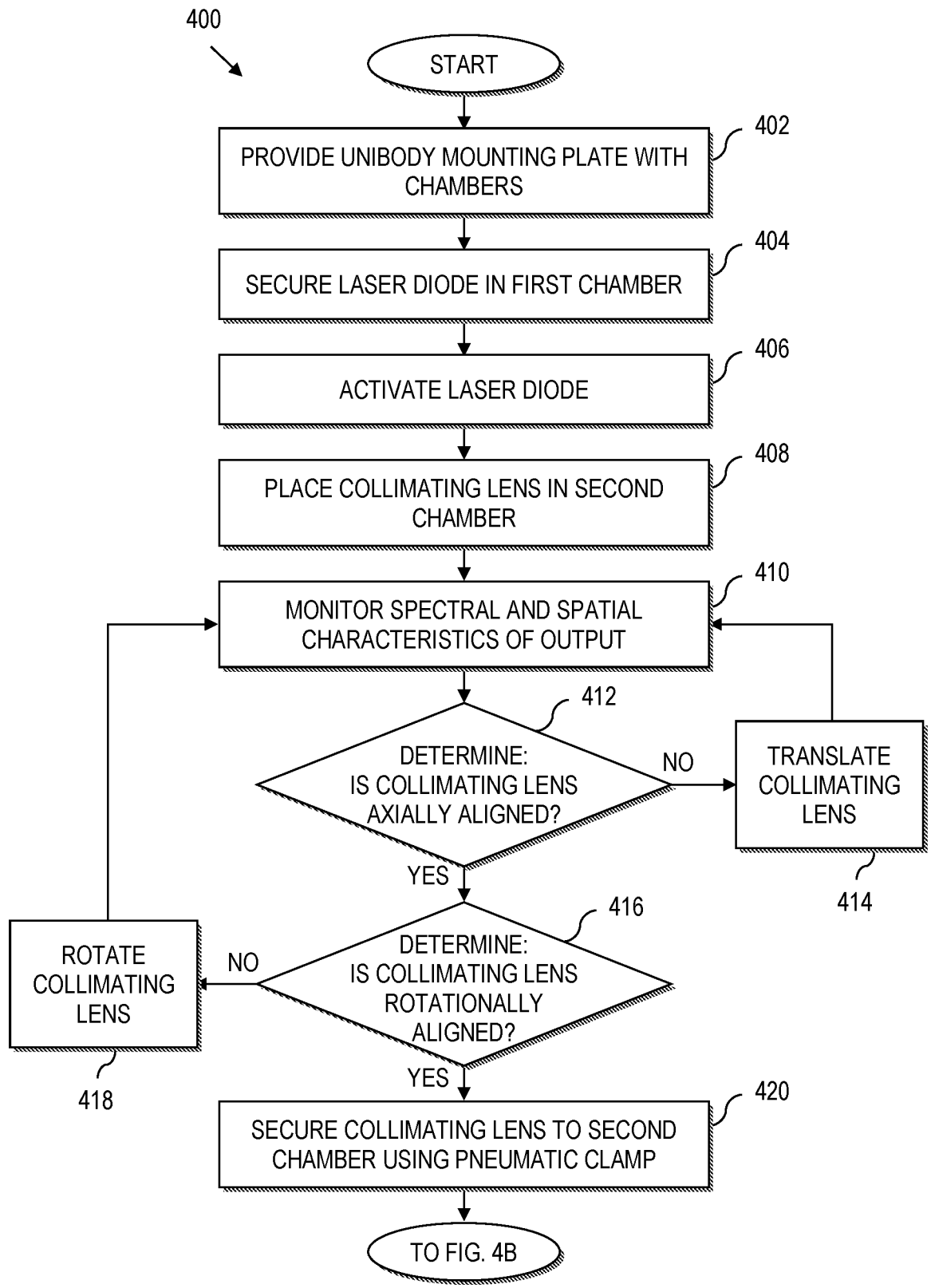
FIGS. 4A, 4B, 4C, 4D, 4E, 4F, 4G, and 4H (collectively designated as FIG. 4) are flowcharts showing another embodiment of a process for manufacturing stabilized lasers.

Starting in FIG. 4A, the process begins by providing 402 a unibody mounting plate with chambers that are aligned along a transmission axis (or transmission pathway). Next, a laser diode is secured 404 in a first chamber such that light from the laser diode transmits along the transmission axis. The secured laser diode is then activated 406, thereby transmitting light along the transmission axis.

Next, a collimating lens is placed 408 in a second chamber, which is located along the transmission axis. Spectral and spatial characteristics of the output from the collimating lens are monitored 410. From the monitored spectral and spatial characteristics, the process determines 412 whether or not the collimating lens is axially aligned, meaning, whether or not the collimating lens needs to be translated up, down, left, right, forward, backward, combination thereof, etc., in order to axially align the collimating lens along the transmission axis. If it is determined 412 that the collimating lens is not axially aligned, then the process translates 414 the collimating lens and monitors 410, again, the spectral and spatial characteristics of the output from the collimating lens. In example configurations, the axial alignment of the collimating lens is accomplished with high precision positioners. If, on the other hand, it is determined 412 that the collimating lens is axially aligned, then it is next determined 416 whether or not the collimating lens is rotationally aligned, meaning, whether the angle in which the collimating lens is mounted should be rotated (or adjusted) in yaw, pitch, roll, a combination thereof, etc., with reference to the transmission axis. If it is determined 416 that the collimating lens is not rotationally aligned, then the process rotates 418 the collimating lens and monitors 410, again, the spectral and spatial characteristics of the output from the collimating lens. Similar to the axial alignment, the rotational alignment is accomplished with high precision positioners. If, however, it is determined 416 that the collimating lens is rotationally aligned (and also axially aligned), then the collimating lens is secured 420 to the second chamber using one or more pneumatic clamps (or other suitable optomechanical holders). By the end of FIG. 4A, the laser diode and the collimating lens have both been placed, aligned, and secured to the unibody mounting plate.

Figure 4B:
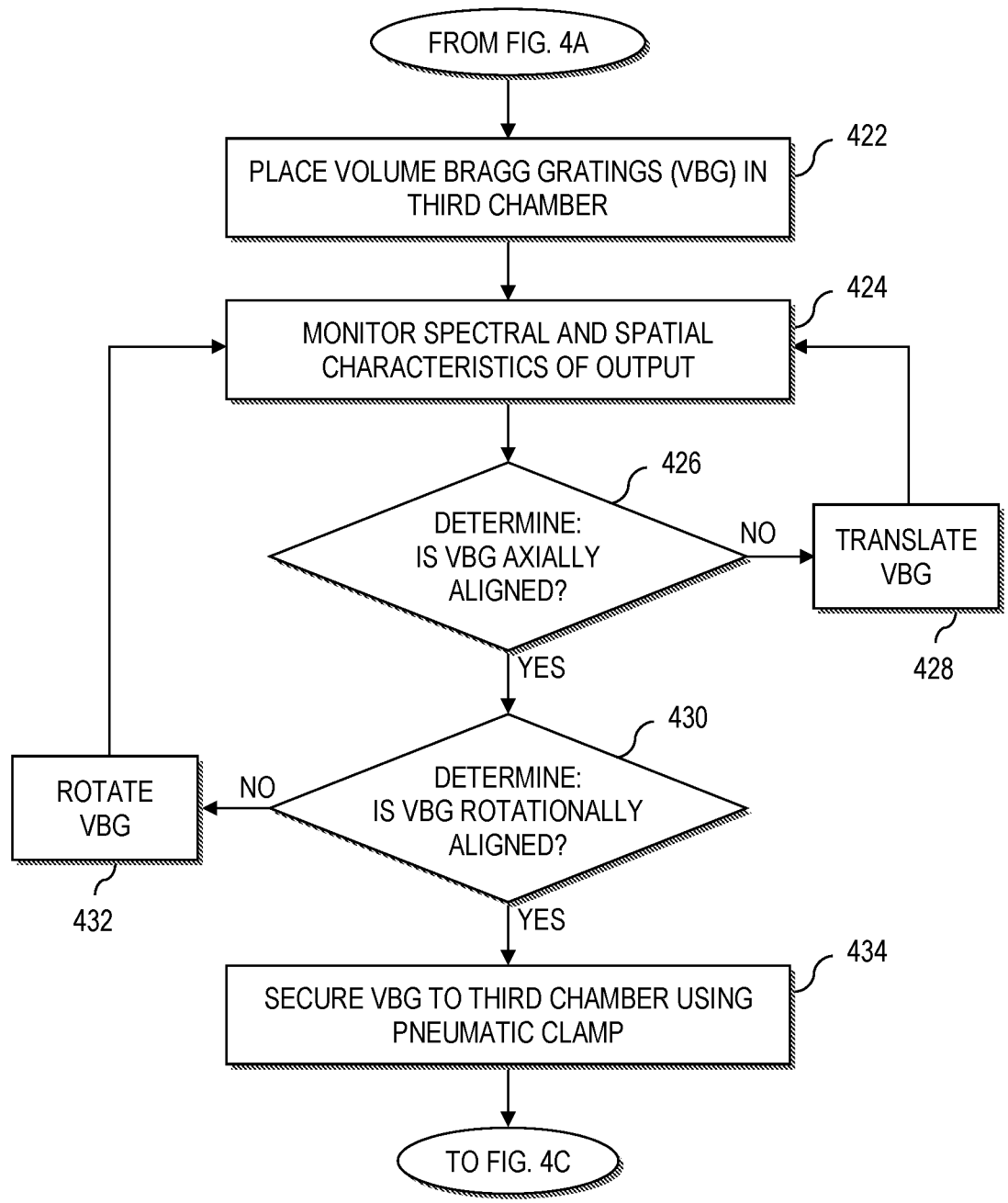

Continuing with FIG. 4B, a volume Bragg grating is placed 422 in a third chamber, which is located next along the transmission axis. The spectral and spatial characteristics of the output of the volume Bragg grating is monitored 424. From this output, the process determines 426 whether or not the volume Bragg grating is axially aligned. If the volume Bragg grating is not axially aligned, then the volume Bragg grating is translated 428 (e.g., up, down, left, right, forward, backward, a combination thereof, etc), similar to how the collimating lens was translated, and the spectral and spatial characteristics of the volume Bragg grating output are again monitored 424. If, however, the volume Bragg grating is axially aligned, then the process determines 430 whether or not the volume Bragg grating is rotationally aligned. If the volume Bragg grating is not rotationally aligned, then the volume Bragg grating is rotated 432 (e.g., roll, pitch, yaw, a combination thereof, etc.), similar to how the collimating lens was rotated. Thereafter, the spectral and spatial characteristics of the volume Bragg grating output are again monitored 424. If, however, the volume Bragg grating is rotationally aligned, then the volume Bragg grating is secured 434 to the third chamber using, for example, a pneumatic clamp. By the end of FIG. 4B, the laser diode, collimating lens, and the volume Bragg grating are aligned and secured in the unibody mounting plate.

Figure 4C:
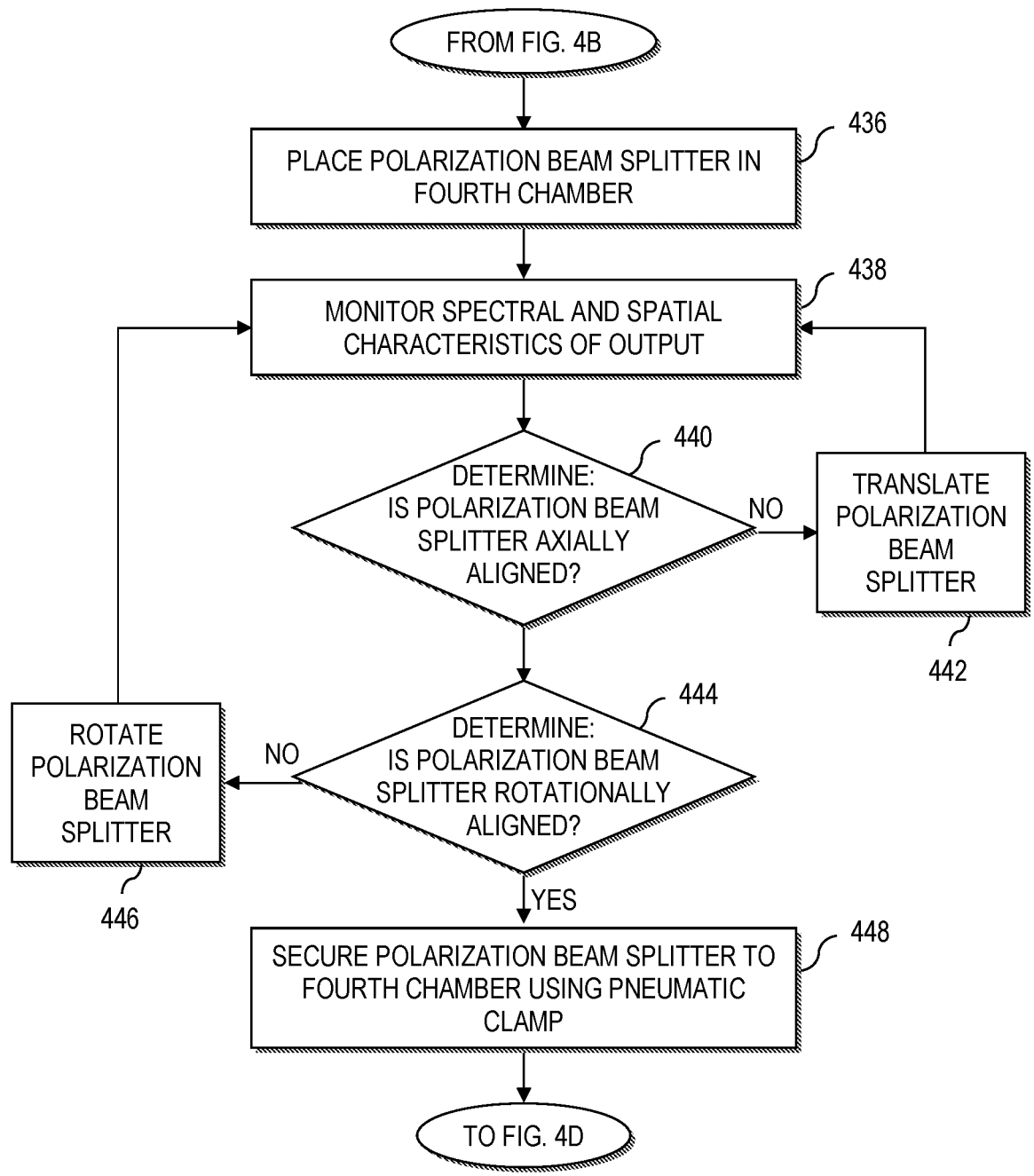

Continuing to FIG. 4C, a polarization beam splitter (or first optical isolator) is placed 436 in a fourth chamber and the spectral and spatial characteristics of the output from the polarization beam splitter are monitored 438. Similar to the prior optic components, the process determines 440 whether or not the polarization beam splitter is axially aligned. If the polarization beam splitter is not axially aligned, then the polarization beam splitter is translated 442 and its output is again monitored 438. If, on the other hand, the polarization beam splitter is axially aligned, then the process next determines 444 whether or not the polarization beam splitter is rotationally aligned. If the polarization beam splitter is not rotationally aligned, then the polarization beam splitter is rotated 446 and its output is again monitored 438. If, however, the polarization beam splitter is rotationally aligned (which, by this time in the process, infers that it is also axially aligned), then the polarization beam splitter is secured 448 to the fourth chamber using, for example, a pneumatic clamp or other optomechanical holder. As one can appreciate, by the conclusion of the process of FIG. 4C, each optic component (e.g., laser diode, collimating lens, volume Bragg grating, and polarization beam splitter) is placed in the unibody mounting plate with a high degree of precision.

Figure 4D:
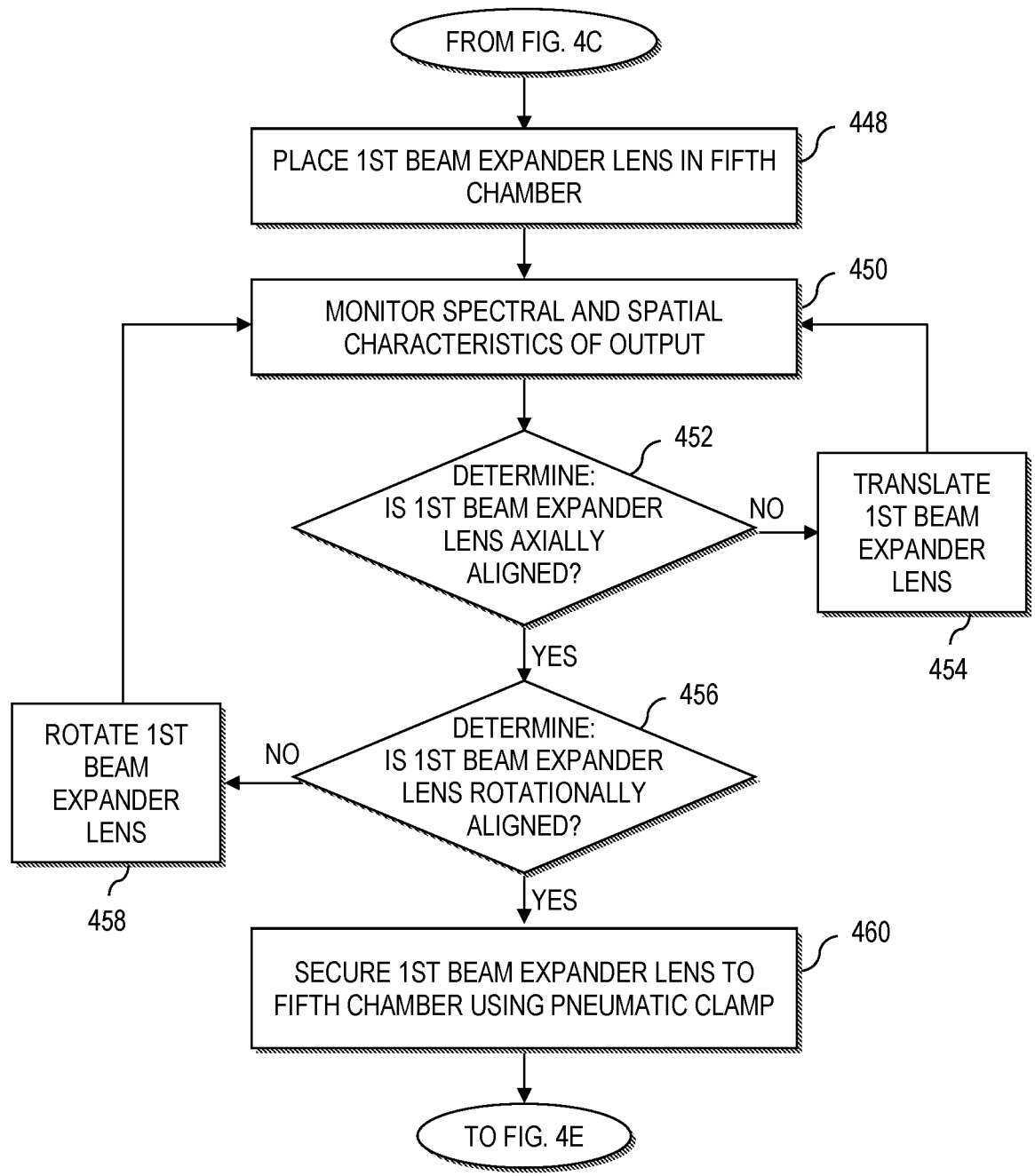

Continuing with FIG. 4D, the process places 448 a first beam expander lens in a fifth chamber and monitors 450 the output from the first beam expander lens. Based on the output characteristics, the process determines 452 whether or not the first beam expander lens is axially aligned. If the first beam expander lens is not axially aligned, then the process translates 454 the first beam expander lens analogous to that set out above, and monitors 450 its output, again.

The process also determines 456 whether or not the first beam expander lens is rotationally aligned. Similarly, if the first beam expander lens is not rotationally aligned, then the process rotates 458 the first beam expander lens analogous to that set out above and, again, monitors 450 its output. These adjustment (translation and rotation) and monitoring steps are repeated recursively (analogously to that set out above) until the first beam expander lens is both axially and rotationally aligned. Thereafter, the first beam expander lens is secured 460 to the fifth chamber using an optomechanical holder, such as a pneumatic clamp in a manner analogous to that set out above.

Figure 4E:
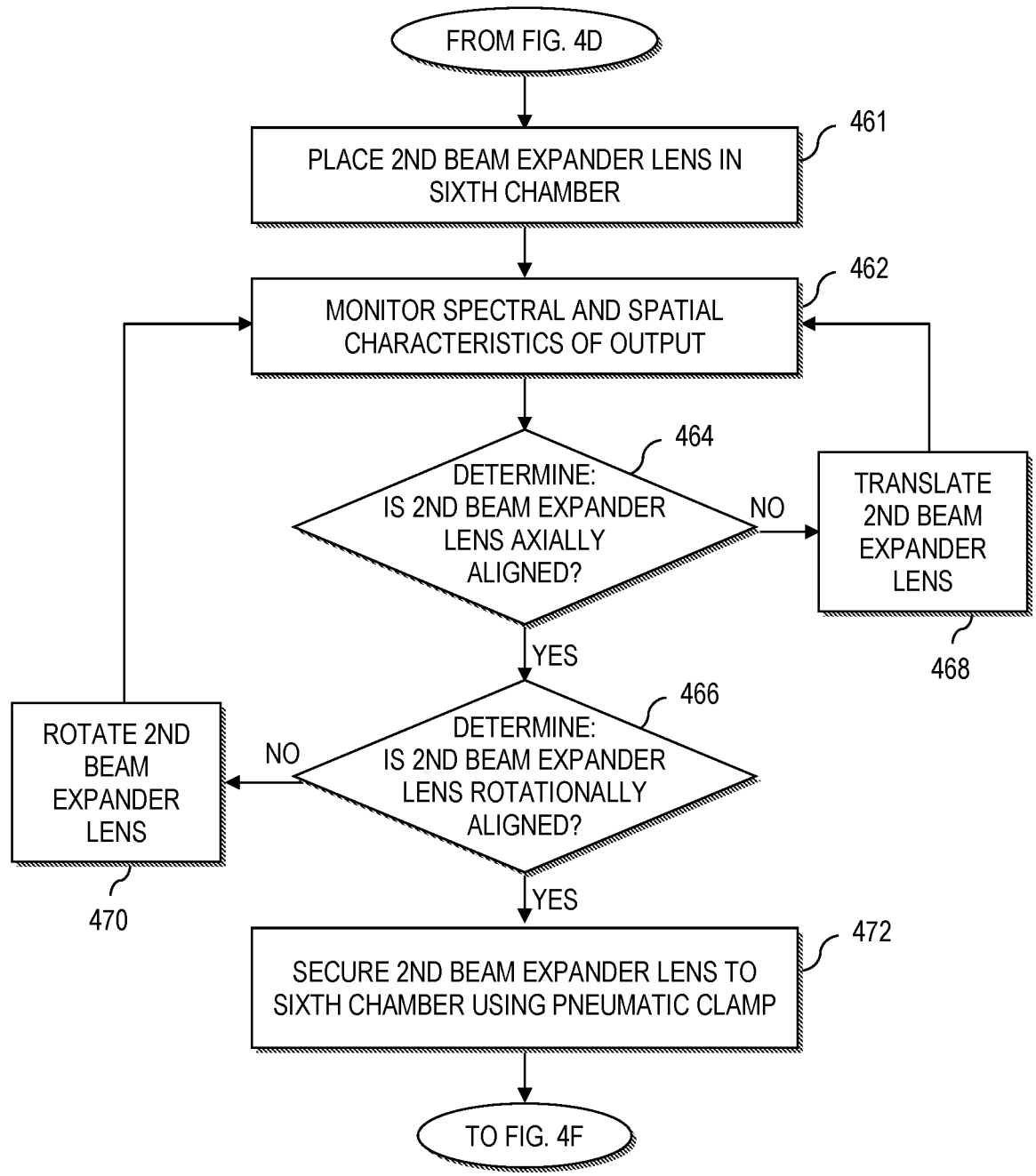

Continuing in FIG. 4E, the process places 461 a second beam expander lens in a sixth chamber and monitors 462 the output from the second beam expander lens. The second beam expander lens works cooperatively with the first beam expander lens to maintain collimation of the light along the transmission axis. Based on the output characteristics, the process determines 464 whether or not the second beam expander lens is axially aligned and, also, determines 466 whether or not the second beam expander lens is rotationally aligned. If the second beam expander lens is not axially aligned, then the process translates 468 the second beam expander lens and monitors 462 its output, again in a manner analogous to that set out above. Similarly, if the second beam expander lens is not rotationally aligned, then the process rotates 470 the second beam expander lens and, again, monitors 462 its output in a manner analogous to that set out above. When the second beam expander lens is both axially and rotationally aligned, the second beam expander lens is secured 472 to the sixth chamber with a pneumatic clamp (or other optomechanical holder) in a manner analogous to that set out above.

Figure 4F:
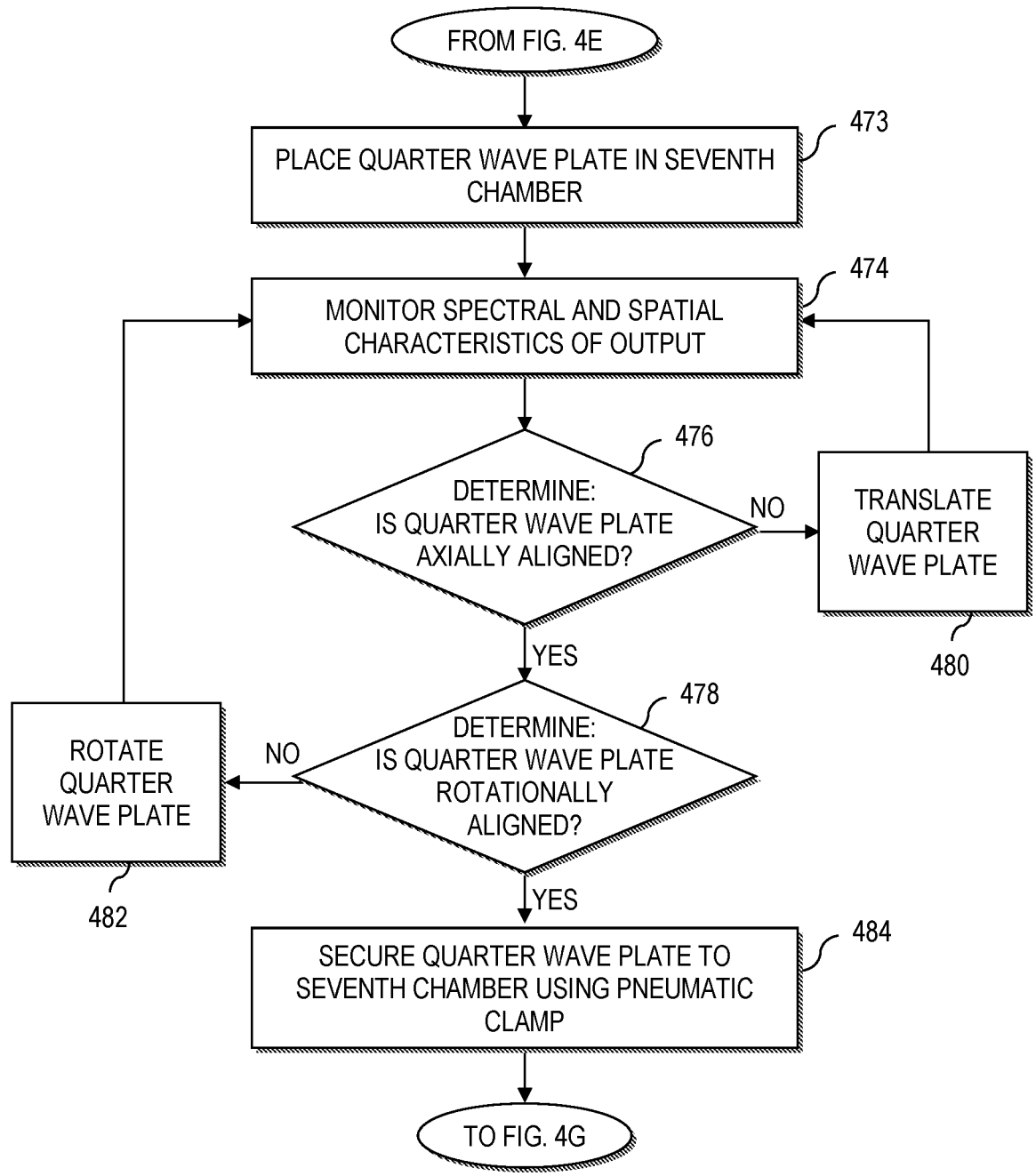

Continuing in FIG. 4F, the process places 473 a quarter wave plate in a seventh chamber, which is located along the transmission axis (along with the first chamber, the second chamber, the third chamber, the fourth chamber, the fifth chamber, and the sixth chamber). The spectral and spatial characteristics of the output of the quarter wave plate are monitored 474 and, from the monitored output, the process determines 476 whether or not the quarter wave plate is axially aligned and, also determines 478 whether or not the quarter wave plate is rotationally aligned. If the quarter wave plate is not axially aligned, then the quarter wave plate is translated 480 and its output characteristics are monitored 474 in a manner analogous to that set out above. Similarly, if the quarter wave plate is not rotationally aligned, then the quarter wave plate is rotated 482 and its output characteristics are monitored 474 in a manner analogous to that set out above. When the quarter wave plate is both axially aligned and rotationally aligned, the quarter wave plate is secured 484 to the seventh chamber using, for example, a pneumatic clamp in a manner analogous to that set out above.

Figure 4G:
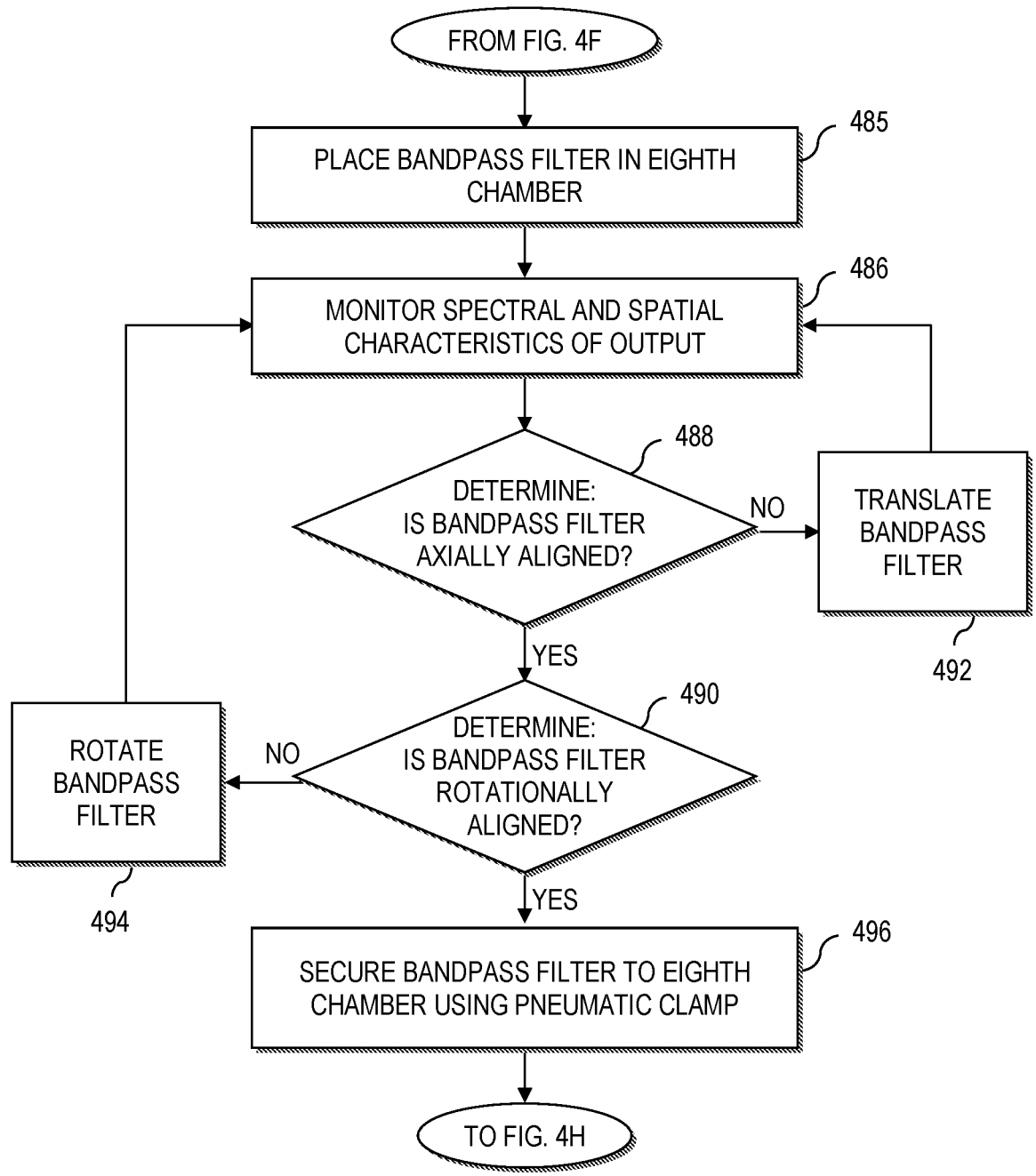

As shown by the process as it continues in FIG. 4G, a bandpass filter is placed 485 in the eighth chamber and the spectral and spatial characteristics of its output are monitored 486. Similar to prior optic components in previous chambers, the process determines 488 whether or not the bandpass filter is axially aligned and further determines 490 whether or not the bandpass filter is rotationally (or angularly) aligned. If the bandpass filter is not axially aligned, then the bandpass filter is translated 492 in a manner analogous to that set out above. Similarly, if the bandpass filter is not rotationally aligned, then the bandpass filter is rotated 494 in a manner analogous to that set out above. Whether translated 492 or rotated 494, the output characteristics are monitored 486 until there is proper alignment (both axially and rotationally) of the bandpass filter. When the bandpass filter is properly aligned (axially and rotationally), the bandpass filter is secured 496 to the eighth chamber using, for example, a pneumatic clamp (or other optomechanical holder) in a manner analogous to that set out above.

By the end of FIGS. 4A through 4G, all of the optic components have been aligned, one-by-one, at each propagation stage and secured in the unibody mounting plate. The alignment is accomplished with high precision positioners, while the securing of the optic components is accomplished with optomechanical holders, such as, for example, pneumatic clamps. Thus, when all of the optic components are eventually secured in the unibody mounting plate, the resulting system provides stabilization for the diode laser, thereby increasing its operational life.

Figure 4H:
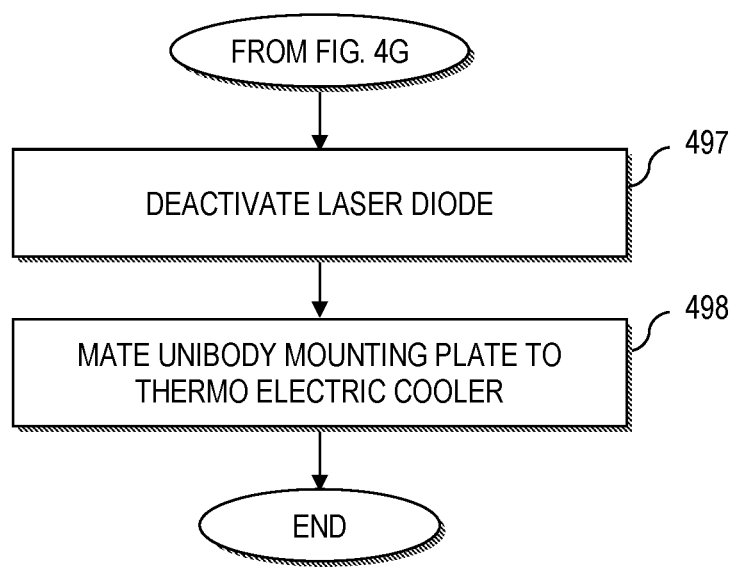

Continuing in FIG. 4H, when all of the components have been secured in their respective channels, the laser diode is deactivated 497. Thereafter, the unibody mounting plate (with all of the components now secured in their respective chambers) is mated 498 to a thermoelectric cooler, at which point the process ends. The processes of FIGS. 3 and 4 produce a system with acceptable tolerances when operating in environmental temperatures that range from −10° C. to +50° C. By improving stabilization, the disclosed embodiments provide a longer usable life for diode lasers.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. Aspects of the disclosure were chosen and described in order to best explain the principles of the disclosure and the practical application, and to enable others of ordinary skill in the art to understand the disclosure for various embodiments with various modifications as are suited to the particular use contemplated.

Any process descriptions or blocks in flow charts should be understood as representing modules, segments, or portions of code which include one or more executable instructions for implementing specific logical functions or steps in the process, and alternate implementations are included within the scope of the preferred embodiment of the present disclosure in which functions may be executed out of order from that shown or discussed, including substantially concurrently or in reverse order, depending on the functionality involved, as would be understood by those reasonably skilled in the art of the present disclosure.

Although exemplary embodiments have been shown and described, it will be clear to those of ordinary skill in the art that a number of changes, modifications, or alterations to the disclosure as described may be made. All such changes, modifications, and alterations should therefore be seen as within the scope of the disclosure.

What is claimed is:

1. A stabilized diode laser device, comprising:
   a unibody mounting plate with chambers;
   a laser diode secured in a first one of the chambers;
   a collimating lens secured in a second one of the chambers;
   a volume Bragg grating secured in a third one of the chambers;
   a first optical isolator secured in a fourth one of the chambers;
   a first beam expander lens secured in a fifth one of the chambers;
   a second beam expander lens secured in a sixth one of the chambers, which is configured to work cooperatively with the first beam expander lens to maintain collimation of propagating light;
   a second optical isolator secured in a seventh one of the chambers, which is configured to work cooperatively with the first optical isolator to reject undesired polarization of propagating light,
   a bandpass filter secured in an eighth one of the chambers;
   wherein the bandpass filter is aligned along a transmission axis with the laser diode, the collimating lens, the volume Bragg grating, the first optical isolator, the first beam expander lens, the second beam expander lens, and the second optical isolator; and
   a thermoelectric cooler mated mechanically to the unibody mounting plate.

2. The stabilized diode laser device of claim 1, wherein the first optical isolator is a polarization beam splitter.

3. The stabilized diode laser device of claim 2, wherein the second optical isolator is a quarter wave plate.

4. The stabilized diode laser device of claim 1, wherein the thermoelectric cooler comprises:
   a heat sink mated mechanically with the unibody mounting plate; and
   a fan.

5. The stabilized diode laser device of claim 1, wherein the aligned collimating lens, the volume Bragg grating, the first optical isolator, the first beam expander lens, the second beam expander lens, and the second optical isolator are secured in their respective chambers by pneumatic clamps.

6. The stabilized diode laser device of claim 1, the collimating lens, the volume Bragg grating, the first optical isolator, the first beam expander lens, the second beam expander lens, and the second optical isolator being secured in the first chamber by optomechanical holders.

7. A stabilized diode laser device, comprising:
   a unibody mounting plate comprising:
      an axis;
      a first chamber located on the axis;
      a second chamber located on the axis;
      a third chamber located on the axis;
      a fourth chamber located on the axis;
      a fifth chamber located on the axis;
      a sixth chamber located on the axis;
      a seventh chamber located on the axis; and
      an eighth chamber located on the axis;

a first optomechanical holder corresponding to the first chamber;

a laser diode secured in the first chamber by the first optomechanical holder, wherein the laser diode is aligned to transmit light along the axis;

a second optomechanical holder corresponding to the second chamber;

a collimating lens secured in the second chamber by the second optomechanical holder, wherein the collimating lens is aligned with the laser diode to propagate the light along the axis;

a third optomechanical holder corresponding to the third chamber;

a volume Bragg grating secured in the third chamber by the third optomechanical holder, wherein the volume Bragg grating is aligned with the laser diode and the collimating lens to further propagate the light along the axis;

a fourth optomechanical holder corresponding to the fourth chamber;

a polarization beam splitter secured in the fourth chamber by the fourth optomechanical holder, wherein the polarization beam splitter is aligned with the laser diode, the collimating lens, and the volume Bragg grating to further propagate the light along the axis;

a fifth optomechanical holder corresponding to the fifth chamber;

a first beam expander lens secured in the fifth chamber by the fifth optomechanical holder, wherein first beam expander lens is aligned with the laser diode, the collimating lens, the volume Bragg grating, and the polarization beam splitter to further propagate the light along the axis;

a sixth optomechanical holder corresponding to the sixth chamber;

a second beam expander lens secured in the sixth chamber by the sixth optomechanical holder, wherein the second beam expander lens is configured to work cooperatively with the first beam expander lens to maintain collimation of the light as the light propagates along the axis, wherein the second beam expander lens is aligned with the laser diode, the collimating lens, the volume Bragg grating, the polarization beam splitter, and the first beam expander lens to further propagate the light along the axis;

a seventh optomechanical holder corresponding to the seventh chamber;

a quarter wave plate secured in the seventh chamber by the seventh optomechanical holder, wherein the quarter wave plate is configured to work cooperatively with the polarization beam splitter to reject undesired polarization of the light as the light propagates along the axis, wherein the quarter wave plate is aligned with the laser diode, the collimating lens, the volume Bragg grating, the polarization beam splitter, the first beam expander lens, and the second beam expander lens to further propagate the light along the axis;

an eighth optomechanical holder corresponding to the eighth chamber;

a bandpass filter secured in the eighth chamber, wherein the bandpass filter is aligned with the laser diode, the collimating lens, the volume Bragg grating, the polarization beam splitter, the first beam expander lens, the second beam expander lens, and the quarter wave plate to further propagate the light along the axis; and a thermoelectric cooler mated mechanically to the unibody mounting plate to stabilize temperatures at the unibody mounting plate wherein the collimating lens, the volume Bragg grating, the polarization beam splitter, the first beam expander, the second beam expander, and the quarter wave plate are aligned axially and rotationally using precision controllers.

* * * * *